(12) United States Patent
Harazono et al.

(10) Patent No.: US 6,825,540 B2
(45) Date of Patent: Nov. 30, 2004

(54) MINIATURIZED, RESIN-SEALED SOLID STATE IMAGING APPARATUS

(75) Inventors: Fumikazu Harazono, Yokohama (JP); Yoshiharu Takade, Yokohama (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/310,163

(22) Filed: Dec. 4, 2002

(65) Prior Publication Data

US 2003/0128291 A1 Jul. 10, 2003

(30) Foreign Application Priority Data

Dec. 5, 2001 (JP) ........................... P.2001-371427
Dec. 5, 2001 (JP) ........................... P.2001-371428

(51) Int. Cl.[7] .............................................. H01L 23/02
(52) U.S. Cl. ..................... 257/436; 257/432; 257/433; 257/434; 361/736; 361/737
(58) Field of Search ..................... 257/432, 433, 257/434, 436, 704, 680, 703, 710, 723; 361/736, 737, 750, 757, 760, 761; 250/338.1, 338.4

(56) References Cited

U.S. PATENT DOCUMENTS 6,072,232 A * 6/2000 Li et al. ..................... 257/680
6,384,473 B1 * 5/2002 Peterson et al. ............ 257/680

FOREIGN PATENT DOCUMENTS

JP 2001-245186 9/2001

* cited by examiner

Primary Examiner—Minhloan Tran
Assistant Examiner—Thomas Dickey
(74) Attorney, Agent, or Firm—Pearne & Gordon LLP

(57) ABSTRACT

A solid-state imaging apparatus includes: a resin structure member configured by an insulating resin and having a through-opening portion a wiring portion is formed on the surface of the resin structure member; a solid-state image pickup element connected to the wiring portion and attached to the through-opening portion; and a light-transmitting member disposed to cover the through-opening portion with being separated from the solid-state image pickup element by a predetermined distance. A fixing member which is smaller in coefficient of thermal expansion than the insulating resin is placed in close proximity to a solid-state image pickup element attaching face.

20 Claims, 13 Drawing Sheets

MINIATURIZED, RESIN-SEALED SOLID STATE IMAGING APPARATUS

BACKGROUND OF THE INVENTION

The present invention relates to a solid-state imaging apparatus and a manufacturing method thereof, and more particularly to a small-sized solid-state imaging apparatus including a solid-state image pickup element, such as a surveillance camera, a medical camera, or a vehicle camera, and a manufacturing method thereof.

An imaging apparatus of this kind receives an image through an optical system such as a lens, and outputs the image in the form of an electric signal. Recently, in accordance with miniaturization and enhancement of the performance of such an imaging apparatus, also the size of a camera is reduced, and an imaging apparatus is used in various fields and expands its market as an image inputting device.

In a conventional imaging apparatus using a solid-state image pickup element, each of components such as a lens, the solid-state image pickup element, and an LSI on which a driving circuit for the element and a signal processing circuit are mounted, has a shape of a case or a structure member, and the components are combined with each other. Conventionally, a mounting structure based on such a combination is formed by mounting elements onto a flat printed circuit board.

In order to further miniaturize such a device, a three-dimensional printed circuit board 101 shown in FIGS. 17 and 18 was proposed in Japanese Patent Publication No. 2001-245186. The printed circuit board 101 is made of a resin in which a mounting member is configured by a leg portion 101A having a rectangular table-like shape, and a body portion 101B formed on the leg portion, and a through-opening portion 101C is formed in the interface between the leg portion 101A and the body portion 101B. A printed wiring pattern 105 is formed on the three-dimensional printed circuit board on side of the rear face of the leg portion 101A. A lens is fitted into the inner periphery of the body portion 101B. While being centered at the optical axis 117 of the lens, an optical filter 103 is placed above the through-opening portion 101C, and a solid-state image pickup element 104 and chip components 108 are placed below the through-opening portion. Further, by using solder 114, the printed wiring pattern 105 formed on the leg portion 101A is connected to a main board 113 of an apparatus such as a portable telephone or a personal computer. FIG. 19 is a view showing main portions of the connections. The solid-state image pickup element 104 is connected to the printed wiring pattern 105 formed on the leg portion 101A, through bumps 106 formed on the surface of the image pickup element 104, and then sealed by a sealing resin 107 to accomplish the connections with the three-dimensional printed circuit board 101.

The identical portions are denoted by the identical reference numerals.

Usually, such a three-dimensional printed circuit board is obtained by injection molding. However, there is a problem in that fillers, which are often used in order to reduce the coefficient of expansion of a resin material, cannot be added in an amount larger than a given one from the viewpoints of the molding accuracy and the durability of molding dies. In addition, fillers are oriented in the molding flow direction to exhibit anisotropic properties that the coefficient is large in a direction perpendicular to the molding flow direction.

A thermoplastic resin usually used in injection molding has a straight-chain molecular structure, and hence exhibits anisotropic properties that the coefficient of linear expansion is small in the molecular bonding direction and large in a direction perpendicular to the bonding direction. Therefore, there is a problem that the circuit board tends to be deformed, particularly, in the direction of a specific direction (a direction perpendicular to the molecular bonding direction).

Therefore, in a heating step in the process of mounting a solid-state image pickup element onto a three-dimensional printed circuit board, the three-dimensional printed circuit board is largely deformed, and a very high stress is generated in connecting portions between the solid-state image pickup element and the three-dimensional printed circuit board, so that a connection failure due to cracking often occurs.

Usually, such connecting portions between a solid-state image pickup element and a three-dimensional printed circuit board are configured by pads disposed on the solid-state image pickup element, and terminals of the three-dimensional printed circuit board. The connection between them is realized by connection using an electrically conductive adhesive agent such as silver paste, ultrasonic bonding, thermocompression bonding, or the like.

In any of the methods, the adhesion of the solid-state image pickup element is easily broken because of thermal deformation of the three-dimensional printed circuit board, and this causes the production yield to be lowered.

When a printed circuit board is three-dimensionally structured, thermal distortion is three times as large as that in the case of a usual two-dimensional structure, thereby causing a large problem in that deformation due to the difference in coefficient of expansion blocks improvement of the yield.

SUMMARY OF THE INVENTION

The invention has been conducted in view of the circumstances. It is an object of the invention to suppress thermal deformation of a resin structure member such as a three-dimensional printed circuit board to ensure connection of a solid-state image pickup element and improve the bonding quality of sealing glass for an optical filter or the like.

According to the present invention, a solid-state imaging apparatus comprises: a resin structure member which is configured by an insulating resin, and which has a through-opening portion; a wiring portion which is formed on a surface of the resin structure member; a solid-state image pickup element which is connected to the wiring portion, and which is attached to the through-opening portion; and a light-transmitting member which is disposed to cover the through-opening portion with being separated from the solid-state image pickup element by a predetermined distance, and a fixing member is placed in close proximity to a portion of the resin structure member to which the solid-state image pickup element is attached, the fixing member being smaller in coefficient of thermal expansion (coefficient in linear expansion) than the insulating resin.

According to the configuration, the fixing member such as a ceramic plate or a metal plate which is smaller in coefficient of thermal expansion than the insulating resin is disposed in the vicinity of the solid-state image pickup element attaching portion. Therefore, thermal deformation of the resin structure member made of the insulating resin can be suppressed, so that the certainty of the connection of the solid-state image pickup element can be enhanced. In the specification, the term "close proximity" means a distance of a degree at which the certainty of the connection of the solid-state image pickup element can be enhanced, including the case where the fixing member is in direct contact with or in the vicinity of the solid-state image pickup element attaching portion.

Moreover, occurrences of connection failures such as separation in an optical filter attaching portion can be reduced.

Preferably, the resin structure member has a leg portion on which the wiring portion is formed, and a cylindrical body portion which is disposed on the leg portion, and the through-opening portion is formed between the body portion and the leg portion.

When this configuration is applied to a conventional device, the whole structure may be miniaturized, but there arises a problem in that a connection failure due to deformation of a connecting portion is easily caused by thermal deformation. By contrast, according to the invention, the fixing member which is smaller in coefficient of thermal expansion than the insulating resin is placed, and therefore thermal deformation of the resin structure member made of the insulating resin can be suppressed, so that the certainty of the connection of the solid-state image pickup element can be enhanced.

Preferably, the fixing member is a plate-like member which is embedded into the resin structure member (insulating resin) to be positioned between a solid-state image pickup element attaching face and a light-transmitting member attaching face.

According to the configuration, since the fixing member is embedded into the insulating resin, the adhesiveness between the insulating resin and the fixing member is excellent, and the workability of a mounting process is improved.

Preferably, the light-transmitting member is disposed on the through-opening portion of the resin structure member through the plate-like member.

According to the configuration, since the light-transmitting member is disposed on the through-opening portion of the resin structure member through the plate-like member of a small coefficient of thermal expansion, deformation of the resin structure member in the fixing portion of the light-transmitting member and in the vicinity of the portion is suppressed. Therefore, thermal deformation of the resin structure member in the vicinity of the solid-state image pickup element can be suppressed, so that the certainty of the connection of the solid-state image pickup element can be enhanced.

Preferably, the light-transmitting member is an optical filter.

The distance between the optical filter and the solid-state image pickup element is an important factor. According to the configuration, deformation of the structure member in the fixing portion of the light-transmitting member and in the vicinity of the portion is suppressed. Therefore, thermal deformation of the resin structure member in the vicinity of the solid-state image pickup element is suppressed, so that the certainty of the distance between the solid-state image pickup element and the optical filter is enhanced to enable more excellent image capturing.

Preferably, the fixing member is configured by a ceramic plate.

According to the configuration, it is possible to obtain a fixing member of less deformation. When a wiring pattern is formed also on the front or rear face of the fixing member, the fixing member can function also as a wiring board.

Preferably, the fixing member is configured by a metal plate.

According to the configuration, the fixing member exerts an excellent heat dissipation property to serve also as a heat sink. Therefore, it is possible to obtain a resin structure member of higher reliability in which deformation of the insulating resin is suppressed.

Preferably, the resin structure member is a structure member which is made of a thermoplastic insulating resin, and which is formed by injection molding.

When such a resin structure member is made of a thermoplastic resin and formed by injection molding, deformation is easily produced particularly during a hardening process, and deformation is produced also when a device is used in a high temperature environment, thereby causing a problem in that a connection failure easily occurs in a portion where the solid-state image pickup element is connected to the resin structure member (three-dimensional printed circuit board). By contrast, according to the configuration, the fixing member such as a ceramic plate or a metal plate which is smaller in coefficient of thermal expansion than the insulating resin is disposed, and therefore thermal deformation of the resin structure member made of the insulating resin is suppressed, so that the certainty of the connection of the solid-state image pickup element can be enhanced.

Preferably, the fixing member is configured by two plate-like members which are placed in parallel along an alignment direction of molecules of the thermoplastic insulating resin.

A thermoplastic resin which is used in injection molding has a straight-chain molecular structure, and hence exhibits anisotropic properties that the coefficient of thermal expansion is small in the molecular bonding direction and large in a direction perpendicular to the bonding direction. Since two plate-like members are formed so as to be in parallel along the alignment direction of molecules, it is possible to suppress the elongation in a direction perpendicular to the molecular bonding direction.

Preferably, the fixing member is configured by two plate-like members which are placed in parallel along an alignment direction of fillers of the thermoplastic insulating resin.

A thermoplastic resin which is used in injection molding exhibits anisotropic properties that the coefficient of thermal expansion is small in the alignment direction of fillers and large in a direction perpendicular to the alignment direction. Since two plate-like members are formed so as to be in parallel along the alignment direction of fillers, it is possible to suppress the elongation in a direction perpendicular to the alignment direction of fillers.

Preferably, the fixing member is an annular plate-like member which is attached to the through-opening portion.

According to the configuration, since the fixing member includes the annular plate-like member, the elongation in all directions is suppressed, and deformation is largely suppressed. Therefore, thermal deformation of the resin structure member in the vicinity of the solid-state image pickup element is suppressed, so that the certainty of the connection of the solid-state image pickup element can be enhanced.

According to the method of manufacturing the solid-state imaging apparatus of the invention, the method comprises: a structure member molding step of molding a structure member which is made of an insulating resin, and which comprises; a through-opening portion; a solid-state image pickup element attaching portion to which a solid-state image pickup element can be attached to close the through-opening portion; a light-transmitting member attaching portion to which a light-transmitting member is to be attached to cover the through-opening portion with being separated from the solid-state image pickup element attaching portion by a predetermined distance; and a fixing member which is embedded in close proximity to the solid-state image pickup element attaching portion, and which is smaller in coefficient of thermal expansion than the insulating resin; a wiring portion forming step of forming a wiring portion on the structure member; a solid-state image pickup element attaching step of attaching the solid-state image pickup element to the solid-state image pickup element attaching portion; and a light-transmitting member attaching step of attaching the light-transmitting member to the light-transmitting member attaching portion.

According to the configuration, since the fixing member is molded so as to be embedded in the resin molding step, the fixing member is formed very easily and surely, and the device is easily mounted.

Preferably, the structure member molding step is an injection molding step of forming the structure member made of a thermoplastic insulating resin by injection molding.

When such a resin structure member is formed by injection molding, deformation is easily produced particularly during a hardening process, and deformation is produced also when a device is used in a high temperature environment, thereby causing a problem in that a connection failure easily occurs in a portion where the solid-state image pickup element is connected to the three-dimensional printed circuit board. By contrast, according to the configuration, the fixing member such as a ceramic plate or a metal plate which is smaller in coefficient of thermal expansion than the insulating resin is disposed, and therefore thermal deformation of the structure member made of the insulating resin is suppressed, so that the certainty of the connection of the solid-state image pickup element can be enhanced.

Preferably, the fixing member is an annular plate-like member.

According to the configuration, since the annular plate-like member is already inserted in the molding process, the elongation in all directions is suppressed, and deformation is largely suppressed. Therefore, thermal deformation of the structure member in the vicinity of the solid-state image pickup element is suppressed, so that the certainty of the connection of the solid-state image pickup element can be enhanced.

Preferably, the fixing member is configured by two plate-like members which are placed in parallel along an injection direction of the thermoplastic resin and in parallel to a face to which the solid-state image pickup element is to be attached.

According to the configuration, the elongation in the direction along which larger elongation occurs is suppressed, and deformation is largely suppressed. Therefore, thermal deformation of the structure member in the vicinity of the solid-state image pickup element is suppressed, so that the certainty of the connection of the solid-state image pickup element can be enhanced.

The method of manufacturing the solid-state imaging apparatus of the invention comprises: a structure member molding step of molding a resin structure member which is made of an insulating resin, and which comprises: a through-opening portion; a solid-state image pickup element attaching portion to which a solid-state image pickup element can be attached to close the through-opening portion; and a light-transmitting member attaching portion to which a light-transmitting member is to be attached to cover the through-opening portion with being separated from the solid-state image pickup element attaching portion by a predetermined distance; a wiring portion forming step of forming a wiring portion on the resin structure member; a solid-state image pickup element attaching step of attaching the solid-state image pickup element to the solid-state image pickup element attaching portion; and a light-transmitting member attaching step of attaching the light-transmitting member to the light-transmitting member attaching portion through a fixing member which is smaller in coefficient of thermal expansion than the insulating resin.

According to the configuration, since the light-transmitting member is attached to the light-transmitting member attaching portion through the fixing member which is smaller in coefficient of thermal expansion than the insulating resin, deformation of the structure member in the fixing portion of the light-transmitting member and in the vicinity of the portion is suppressed. Therefore, thermal deformation of the structure member in the vicinity of the solid-state image pickup element can be suppressed, so that the certainty of the connection of the solid-state image pickup element can be enhanced. The attachment of the fixing member may be conducted before the solid-state image pickup element is attached.

Preferably, the structure member molding step is an injection molding step of forming the structure member by using a thermoplastic insulating resin by injection molding.

When such a resin structure member is formed by injection molding, deformation is easily produced particularly during a hardening process, and deformation is produced also when a device is used in a high temperature environment, thereby causing a problem in that a connection failure easily occurs in a portion where the solid-state image pickup element is connected to the three-dimensional printed circuit board. By contrast, according to the configuration, the fixing member such as a ceramic plate or a metal plate which is smaller in coefficient of thermal expansion than the insulating resin is disposed, and therefore thermal deformation of the structure member made of the insulating resin is suppressed, so that the certainty of the connection of the solid-state image pickup element can be enhanced.

Preferably, the attaching step includes a step of inserting the light-transmitting member through an annular plate-like member serving as the fixing member.

Preferably, the attaching step includes a step of inserting in parallel two plate-like members serving as the fixing member along an injection direction of a thermoplastic resin.

Further, according to the invention, a solid-state imaging apparatus comprises: a structure member which is configured by an insulating resin made of a thermoplastic resin, and which has a through-opening portion; a wiring portion which is formed on a surface of the structure member; a solid-state image pickup element which is connected to the wiring portion, and which is attached to the structure member to cover the through-opening portion; and a light-transmitting member which is attached to the structure member to cover the through-opening portion with being separated from the solid-state image pickup element by a predetermined distance, and the structure member comprising an interface in which molecular bonding directions or alignment directions of fillers are different from each other, at a position which is parallel to an attaching face of the solid-state image pickup element, and in the vicinity of a solid-state image pickup element attaching face to which the solid-state image pickup element is to be attached.

When such a structure member is made of a thermoplastic resin and formed by injection molding, deformation is easily produced particularly during a hardening process, and deformation is produced also when a device is used in a high temperature environment, thereby causing a problem in that a connection failure easily occurs in a portion where the solid-state image pickup element is connected to the structure member (three-dimensional printed circuit board). This deformation easily occurs particularly in a direction perpendicular to the injection direction. By contrast, according to the configuration, the device comprises the interface in which molecular bonding directions are different from each other, at a position which is parallel to an attaching face of the solid-state image pickup element, and in the vicinity of the solid-state image pickup element attaching face, and hence elongation directions on both the sides of the interface are different from each other. Therefore, stresses cancel each other, and expansion and contraction due to heat are reduced. In both mounting and use, deformation of the structure member is suppressed, the positional accuracy between the light-transmitting member such as an optical filter and the solid-state image pickup element can be maintained to a high level, and connection failures between the solid-state image pickup element and the wiring portion of the structure member are reduced to enhance the certainty of the connection of the solid-state image pickup element. As a result, it is possible to provide a solid-state imaging apparatus of high reliability.

Moreover, occurrences of connection failures such as separation in the optical filter attaching face can be reduced.

Since the structure member can be formed by the same material, there is no difference in coefficient of thermal expansion, and hence generation of distortion can be suppressed.

In the specification, the term "vicinity" means a distance of a degree at which the certainty of the attachment of the solid-state image pickup element can be enhanced, including the case where the fixing member is in direct contact with or in close proximity to the solid-state image pickup element attaching face.

In the interface of the structure member, the molecular bonding directions or alignment directions of fillers have a difference of 45 to 90 degrees.

When the structure member is formed so as to produce a difference of 45 to 90 degrees in molecular bonding direction, particularly, deformation of the interface in the vicinity of the attaching face can be efficiently suppressed by a directional anisotropy of elongation depending on the molecular bonding direction. Therefore, connection failures can be prevented most efficiently from occurring, and hence the certainty of the connection of the solid-state image pickup element can be enhanced.

Preferably, the interface of the structure member is formed by bonding a fixing plate to an attaching face of the light-transmitting member, the fixing plate being made of a thermoplastic resin and molded to produce different molecular bonding directions in the attaching face.

According to the configuration, the light-transmitting member is disposed in the through-opening portion of the structure member through the fixing plate which is made of a thermoplastic resin, and which is molded so as to produce a difference in molecular bonding direction. Therefore, deformation of the structure member in the fixing position of the light-transmitting member and in the vicinity of the position is suppressed, so that thermal deformation of the structure member in the vicinity of the solid-state image pickup element can be suppressed and the certainty of the connection of the solid-state image pickup element can be enhanced. Since the fixing plate can be formed by the same material as the structure member, there is no difference in coefficient of thermal expansion, and hence generation of distortion can be suppressed.

Preferably, the fixing plate is configured by two plate-like members which are placed in parallel along an alignment direction of molecules or an alignment direction of fillers of the thermoplastic insulating resin.

According to the configuration, when the two plate-like members are formed so as to be parallel to the alignment direction of molecules, it is possible to suppress the elongation in a direction perpendicular to the molecular bonding direction.

Preferably, the fixing plate is an annular plate-like member which is bonded to the through-opening portion.

According to the configuration, since the fixing plate is an annular plate-like member, the elongation in all directions is suppressed, and deformation is largely suppressed. Therefore, thermal deformation of the structure member in the vicinity of the solid-state image pickup element is suppressed, so that the certainty of the connection of the solid-state image pickup element can be enhanced.

Preferably, the structure member is integrally molded to have the interface by injection molding of a thermoplastic resin.

According to the configuration, the structure member can be formed by integral molding which is conducted simply by changing the injection direction to form the interface. Therefore, a bonding process is not required, and the device can be easily produced.

Preferably, the structure member is configured by at least two split structure members which are made of a thermoplastic resin, and which are molded in a split manner to produce different molecular bonding directions or alignment directions of fillers in the interface, and the structure member is formed by bonding the split structure members to each other.

According to the configuration, the structure member is formed in a split manner so as to produce different molecular bonding directions in the interface, and the split members are then bonded to each other. Therefore, the configuration of the molding dies can be simplified. It is requested only to change the injection direction while using molding dies of a cavity which is one half of that in the conventional art consequently, adjustment is not required. Although the number of steps is increased, the manufacturing steps themselves can be simplified.

Preferably, the structure member is integrally molded to seal a fixing plate made of a thermoplastic resin, and molecular bonding directions in an interface with the fixing plate are different from each other.

According to the configuration, the fixing plate which is made of a thermoplastic resin, and which is molded so as to have a difference in molecular bonding direction is placed in injection molding dies, and usual injection molding is then conducted, whereby the fixing plate is easily sealed to suppress deformation of the structure member in the sealing portion and in the vicinity of the portion. Therefore, thermal deformation of the structure member in the vicinity of the solid-state image pickup element can be suppressed and the certainty of the connection of the solid-state image pickup element can be enhanced. Since the fixing plate can be formed by the same material as the structure member, there is no difference in coefficient of thermal expansion, and hence generation of distortion can be suppressed.

Preferably, the structure member has a leg portion on which the wiring portion is formed, and a cylindrical body portion which is disposed on the leg portion, and the through-opening portion is formed between the body portion and the leg portion.

When this configuration is applied to a conventional device, particularly, the whole structure of the device can be miniaturized, but there is a problem in that a connection failure is easily caused by deformation of the connecting portion due to thermal deformation. By contrast, according to the invention, thermal deformation of the structure member made of the insulating resin can be very easily suppressed to enhance the connection of the solid-state image pickup element, by changing the alignment direction of molecules.

According to the method of manufacturing the solid-state imaging apparatus of the invention, the method comprises: a through-opening portion; a solid-state image pickup element attaching face which allows a solid-state image pickup element to be mounted in the through-opening portion; and a light-transmitting member attaching face to which a light-transmitting member is to be attached to cover the through-opening portion with being separated from the solid-state image pickup element attaching face by a predetermined distance; a wiring portion forming step of forming a wiring portion on the structure member; a solid-state image pickup element attaching step of mounting the solid-state image pickup element onto the solid-state image pickup element attaching face; and a light-transmitting member attaching step of attaching the light-transmitting member to the light-transmitting member attaching face, the structure member forming step being a structure member molding step of forming the structure member to produce an interface in which molecular bonding directions are different from each other, at a position which is parallel to an attaching face of the solid-state image pickup element, and in the vicinity of the solid-state image pickup element.

According to the method, when an insulating thermoplastic resin is injected into molding dies in directions which are made different from each other with setting the interface as a boundary to produce the interface in which alignment directions of molecules are different from each other, a structure member in which the solid-state image pickup element attaching face is less deformed can be easily formed. The positional accuracy between the light-transmitting member such as an optical filter and the solid-state image pickup element can be maintained to a high level, and connection failures between the solid-state image pickup element and the wiring portion of the structure member are reduced to enhance the certainty of the connection of the solid-state image pickup element. As a result, it is possible to provide a solid-state imaging apparatus of high reliability.

Preferably, the interface of the structure member is formed to allow the molecular bonding directions to have a difference of 45 to 90 degrees.

Preferably, the structure member forming step is a step of injecting an insulating thermoplastic resin into molding dies in directions which are made different from each other with setting the interface as a boundary, to produce a difference in injection direction in the molding dies.

According to the configuration, when usual injection molding is conducted in injection molding dies while changing the injection direction, deformation of the structure member can be easily suppressed. Therefore, thermal deformation of the structure member in the vicinity of the solid-state image pickup element can be suppressed and the certainty of the connection of the solid-state image pickup element can be enhanced. Since the structure member is formed by the same material, there is no difference in coefficient of thermal expansion, and hence generation of distortion can be suppressed.

Preferably, the structure member forming step includes a step of conducting injection molding in a state where a resin-made fixing plate which is formed to have a different alignment direction of molecules is previously inserted into the molding dies.

According to the configuration, the fixing plate which is made of a thermoplastic resin, and which is molded so as to have a difference in molecular bonding direction is placed in injection molding dies, and usual injection molding is then conducted, whereby the fixing plate is easily sealed to suppress deformation of the structure member in the sealing portion and in the vicinity of the portion. Therefore, thermal deformation of the structure member in the vicinity of the solid-state image pickup element can be suppressed and the certainty of the connection of the solid-state image pickup element can be enhanced. Since the fixing plate can be formed by the same material as the structure member, there is no difference in coefficient of thermal expansion, and hence generation of distortion can be suppressed.

Preferably, the method of manufacturing a solid-state imaging apparatus of the invention comprises: a structure member forming step of forming a resin structure member which is made of an insulating resin, and which comprises: a through-opening portion; a solid-state image pickup element attaching face which allows a solid-state image pickup element to be mounted in the through-opening portion; and a light-transmitting member attaching face to which a light-transmitting member is to be attached to cover the through-opening portion with being separated from the solid-state image pickup element attaching face by a predetermined distance; a wiring portion forming step of forming a wiring portion on the structure member; a solid-state image pickup element attaching step of mounting the solid-state image pickup element onto the solid-state image pickup element attaching face; and a light-transmitting member attaching step of attaching the light-transmitting member to the light-transmitting member attaching face through a fixing plate which is made of a thermoplastic resin of a different alignment direction of molecules.

According to the configuration, since the light-transmitting member is attached through the fixing plate which is made of a thermoplastic resin, and which is molded so as to have a difference in molecular bonding direction, deformation of the structure member in the vicinity of the portion is suppressed. Therefore, thermal deformation of the structure member in the vicinity of the solid-state image pickup element can be suppressed and the certainty of the connection of the solid-state image pickup element can be enhanced. Since the fixing plate can be formed by the same material as the structure member, there is no difference in coefficient of thermal expansion, and hence generation of distortion can be suppressed.

Preferably, the interface is formed to produce a difference in molecular bonding direction of 45 to 90 degrees.

Preferably, the method of manufacturing a solid-state imaging apparatus comprises: a structure member forming step of forming a resin structure member which is made of an insulating resin, and which comprises: a through-opening portion; a solid-state image pickup element attaching face which allows a solid-state image pickup element to be mounted in the through-opening portion; and a light-transmitting member attaching face to which a light-transmitting member is to be attached to cover the through-opening portion with being separated from the solid-state image pickup element attaching face by a predetermined distance, as at least two split structure members which are made of a thermoplastic resin, and which are molded in a split manner to produce different molecular bonding directions in an interface which is in the vicinity of the solid-state image pickup element attaching face and parallel to an attaching face of the solid-state image pickup element; a wiring portion forming step of forming a wiring portion on the split structure members; a bonding step of bonding the split structure members together to form the structure member; a solid-state image pickup element attaching step of mounting the solid-state image pickup element onto the solid-state image pickup element attaching face; and a light-transmitting member attaching step of attaching the light-transmitting member to the light-transmitting member attaching face.

According to the configuration, in the resin molding step, the structure member is molded into two split structure members, and the members are bonded together, whereby the vicinity of the solid-state image pickup element attaching face can be prevented very easily and surely from being deformed. Therefore, the device can be easily mounted, and connection failures due to deformation during use can be reduced.

Preferably, the interface is formed to allow the molecular bonding directions to have a difference of 45 to 90 degrees.

Preferably, the structure member forming step is a step of injecting an insulating thermoplastic resin into molding dies in directions which are different from each other with setting the interface as a boundary, to produce a difference in injection direction in the interface.

According to the configuration, structure members which are injection-molded while making the injection directions different from each other are formed as split structure members, and the members are then bonded together. Therefore, the apparatus can be manufactured very easily.

DETAILED DESCRIPTION OF THE PREFERRED EMBODIMENT

Hereinafter, embodiments of the invention will be described with reference to the accompanying drawings.

(Embodiment 1)

Figure 1:
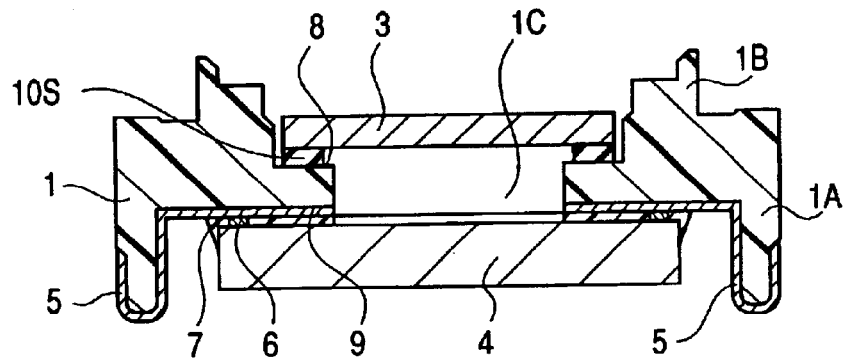
FIG. 1 is a section view showing a solid-state imaging apparatus of a first embodiment of the invention.

FIG. 1 is a view showing main portions of a solid-state imaging apparatus according to a first embodiment of the invention.

According to the solid-state imaging apparatus of the first embodiment, when a solid-state image pickup element 4 is to be connected to a resin structure member 1 having a wiring portion, a structure member 1 is formed in which an optical filter 3 is attached to an optical filter attaching face 8 of the resin structure member 1 through a ceramic plate 10S which is smaller in coefficient of thermal expansion than the resin structure member 1.

Figure 2:
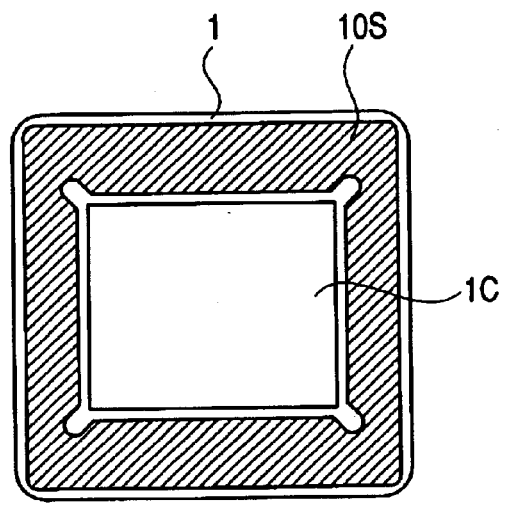
FIG. 2 is a view showing a ceramic plate which is used in the first embodiment of the invention.

As shown in FIG. 2, the ceramic plate 10S serving as the fixing member has a rectangular annular shape of a thickness t=about 0.1 to 0.2 mm and a coefficient of thermal expansion of about 10 ppm/° C. The ceramic plate is configured by an insulating polyphthalamide resin. The imaging apparatus includes: the resin structure member 1 which is configured by a leg portion 1A having a rectangular table-like shape and a body portion 1B formed on the leg portion 1A which has a through-opening portion 1C that is formed in the interface between the leg portion 1A and the body portion 1B, and which has a wiring portion including a terminal pattern 5 in a part of the surface; the solid-state image pickup element 4 which is connected to the wiring portion, attached to the through-opening portion 1C, and electrically connected to the terminal pattern 5; and the optical filter 3 which is made of a light-transmitting resin, and which is placed to cover the through-opening portion 1C with being separated from the solid-state image pickup element 4 by a predetermined distance.

Next, a method of manufacturing the solid-state imaging apparatus will be described.

Figure 4A:
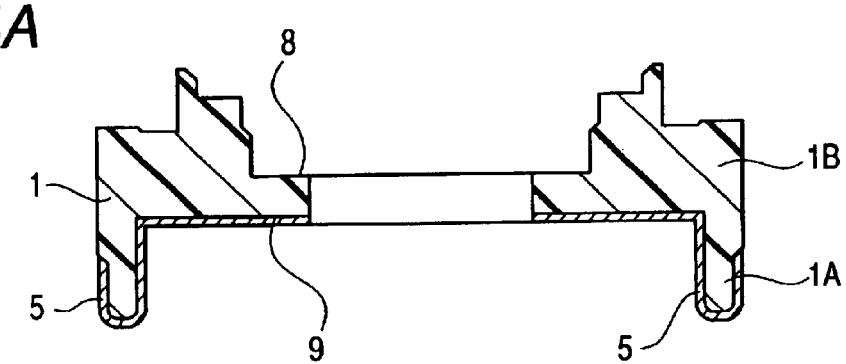
FIGS. 4A to 4D are views showing steps of mounting the solid-state imaging apparatus of the first embodiment of the invention.

As shown in FIG. 4A, first, the resin structure member 1 is formed by injection molding, so that the structure member 1 is configured by the leg portion 1A having a rectangular table-like shape, and the body portion 1B formed on the leg portion, in which the through-opening portion 1C is formed in the interface between the leg portion 1A and the body portion 1B, and which is made of a polyphthalamide resin. Then, the wiring portion including the terminal pattern 5 formed on the rear face of the leg portion 1A is formed in a predetermined area of the resin structure member 1 by a plating process or a thin film process such as the sputtering technique.

Figure 4B:
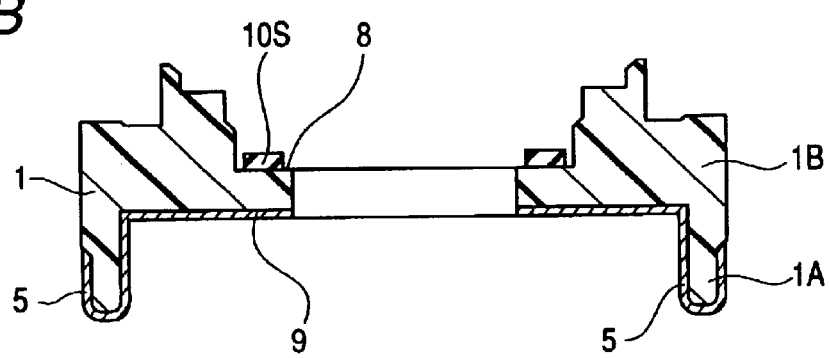

As shown in FIG. 4B, the ceramic plate 10S shown in FIG. 2 is then bonded to the optical filter attaching face 8 of the resin structure member 1 by using an adhesive resin (not shown), thereby forming the structure member 1.

Figure 4C:
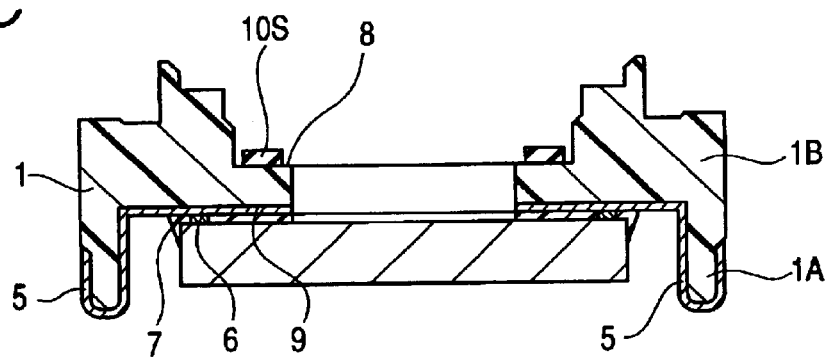

As shown in FIG. 4C, thereafter, the solid-state image pickup element (chip) 4 is mounted onto one face (solid-state image pickup element attaching face) 9 of the through-opening portion 1C of the resin structure member 1. Bumps 6 are previously formed on contact terminals of the solid-state image pickup element 4, and the terminals are connected by thermocompression bonding to ends of the terminal patterns formed on the leg portion 1A of the resin structure member 1. Then, a resin sealing process is conducted to cover the surface of the solid-state image pickup element 4 by a resin sealing member 7.

Figure 4D:
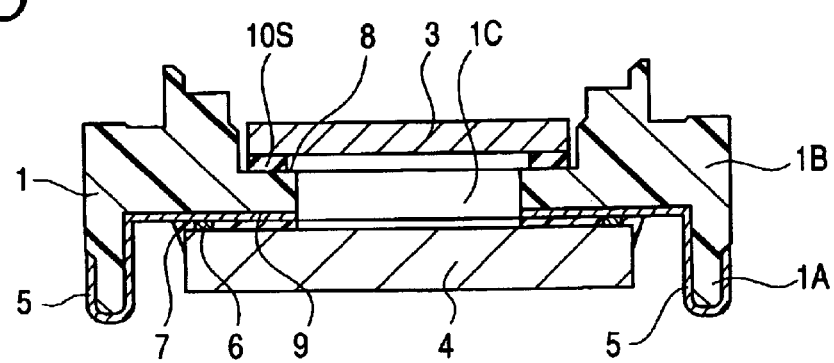

As shown in FIG. 4D, thereafter, the optical filter 3 is bonded onto the ceramic plate 10S by using an adhesive resin. Alternatively, the ceramic plate 10S and the optical filter 3 may be simultaneously bonded by using the same adhesive resin.

In the optical filter 3, a dielectric thin film of a multilayer structure having a desired refractive index is vapor-deposited onto the surface of a light-transmitting member made of a plate glass material to form a dielectric interference filter.

In the thus formed solid-state imaging apparatus, the ceramic plate 10S having smaller coefficient of thermal expansion than the structure member 1 is attached to the optical filter attaching face 8 which is close to the solid-state image pickup element attaching portion 9 of the resin structure member 1, thermal deformation of the resin structure member 1 is suppressed by the ceramic plate 10S, whereby the certainty of the connection of the solid-state image pickup element 4 can he enhanced.

The resin structure member 1 is obtained by injection molding. The polyphthalamide resin has a straight-chain molecular structure, and hence exhibits anisotropic properties that the coefficient of thermal expansion is small in the molecular bonding direction and large in a direction perpendicular to the bonding direction.

Figure 3:
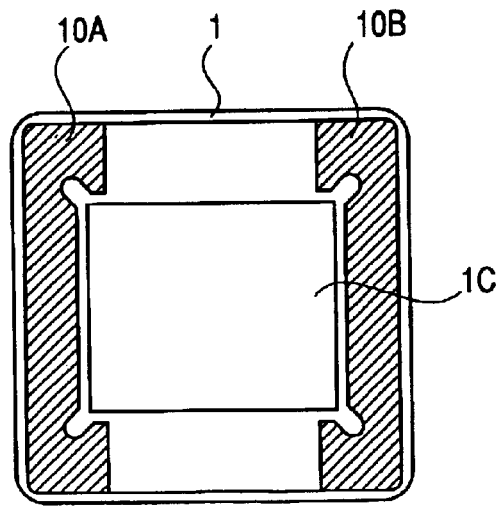
FIG. 3 is a view showing a modification of the ceramic plate which is used in the first embodiment of the invention.

In the first embodiment, therefore, the ceramic plate 10A which is formed into a rectangular annular shape as shown in FIG. 2 is used. Alternatively, as shown in FIG. 3, two strip-like ceramic plates 10A and 10B may be attached along the injection direction of the thermoplastic resin or the alignment direction of fillers so as to be parallel to each other and in parallel to the attaching face.

According to the configurations the elongation in the direction along which larger elongation occurs is suppressed, and deformation is largely suppressed. Therefore, thermal deformation of the structure member in the vicinity of the solid-state image pickup element is suppressed, so that the certainty of the connection of the solid-state image pickup element can be enhanced.

(Embodiment 2)

Next, a second embodiment of the invention will be described with reference to FIG. 5.

according to the solid-state imaging apparatus of the second embodiment, the structure member 1 is integrally molded in a state where a metal plate 10M is sandwiched in the resin structure member 1. In the embodiment, the structure member 1 is formed by conducting integral molding in a state where the metal plate 10M is sandwiched at a position where the rear face of the optical filter 3 is in contact with the surface of the metal plate 10M sandwiched in the resin structure member 1.

Figure 5:
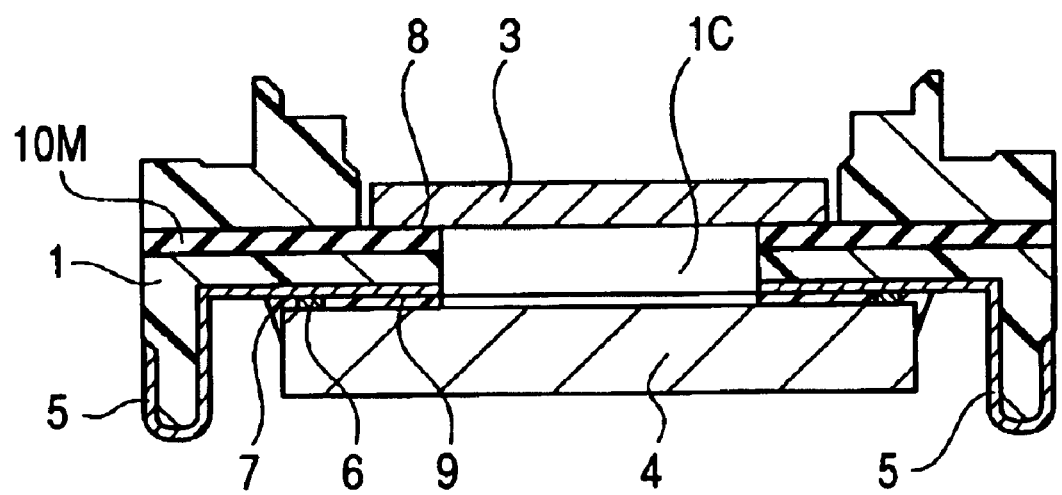
FIG. 5 is a section view showing a solid-state imaging apparatus of a second embodiment of the invention.

In the solid-state imaging apparatus, as shown in FIG. 5, the metal plate 10M having a rectangular annular shape is integrally molded between the optical filter attaching face 8 of the resin structure member 1 which has a wiring portion, and which is made of a thermoplastic PPS resin, and the solid-state image pickup element attaching face 9 so as to be parallel to these faces, whereby deformation of the solid-state image pickup element attaching face 9 is suppressed.

The other portions are formed in the same manner as those of the first embodiment. The identical portions are denoted by the identical reference numerals.

Next, a method of manufacturing the solid-state imaging apparatus will be described.

Figure 6A:
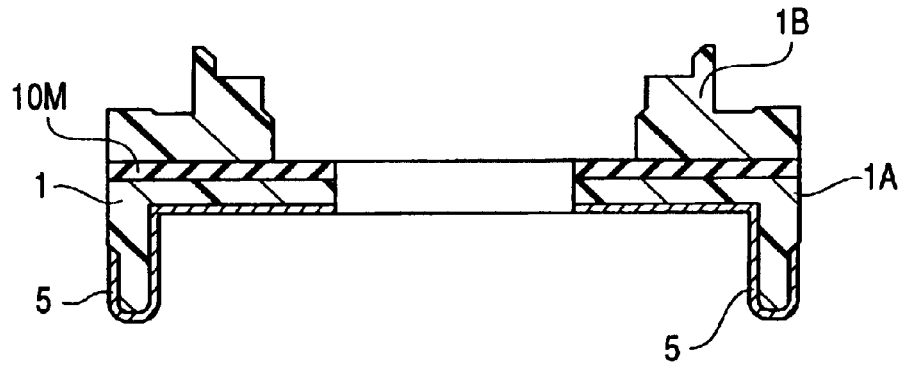
FIGS. 6A to 6C are views showing steps of mounting the solid-state imaging apparatus of the second embodiment of the invention.

First, the metal plate 10M having a rectangular annular shape is placed in a cavity of injection molding dies (not shown). Under this state, a PPS resin is injected into the cavity, and then cured. As a result, as shown in FIG. 6A, the structure member 1 is formed which is made of the PPS resin, which is configured by the leg portion 1A having a rectangular table-like shape, and the body portion 1B formed on the leg portion 1A, and in which the through-opening portion 1C is formed in the interface between the leg portion 1A and the body portion 1B and the metal plate 10M is integrally molded. Then, the wiring portion including the terminal pattern 5 formed on the rear face of the leg portion 1A is formed in a predetermined area of the structure member 1 by a plating process or a thin film process such as the sputtering technique.

Figure 6B:
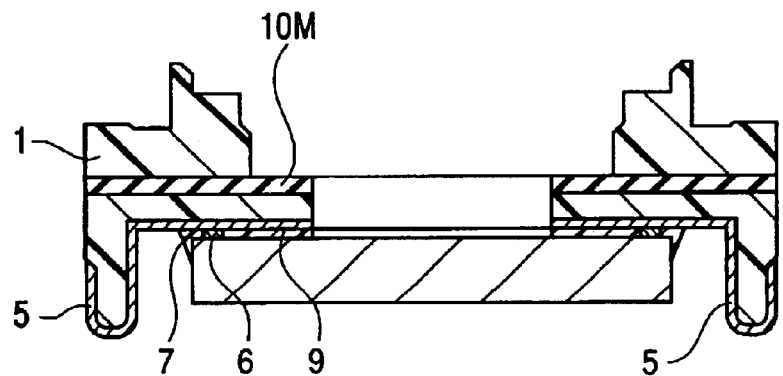

As shown in FIG. 6B, the solid-state image pickup element (chip) 4 is mounted onto one face of the through-opening portion of the structure member 1 into which the metal plate 10M is sealed to prevent deformation. Bumps 6 are previously formed on contact terminals of the solid-state image pickup element, and the terminals are connected by thermocompression bonding to ends of the terminal patterns formed on the leg portion 1A of the structure member 1. Then, the surface of the solid-state image pickup element is covered by a resin sealing member 7.

Figure 6C:
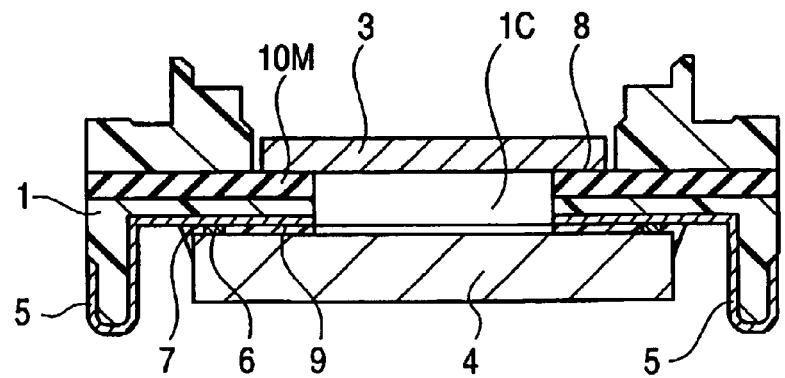

As shown in FIG. 6C, thereafter, the optical filter 3 is bonded onto the optical filter attaching face 8 of the structure member 1 by using an adhesive resin.

In the same manner as the optical filter used in the first embodiment, the optical filter 3 is a filter in which a dielectric thin film of a multilayer structure having a desired refractive index is vapor-deposited onto the surface of a light-transmitting member made of a plate glass material to form a dielectric interference filter.

In the thus formed solid-state imaging apparatus, the solid-state image pickup element 4 is attached, in the state where the metal plate 10M in which the coefficient of thermal expansion is smaller than that of the resin structure member 1 is sealed, on the optical filter attaching face 8 which is close to the solid-state image pickup element attaching portion 9 of the structure member 1. Therefore, thermal deformation of the resin structure member 1 is suppressed by the metal plate 10M, whereby the certainty of the connection of the solid-state image pickup element 4 can be enhanced.

According to the configuration, since the metal plate 10M serving as the fixing member is molded so as to be embedded in the resin molding step, the fixing member is formed very easily and surely, and easily mounted.

(Embodiment 3)

Figure 7:
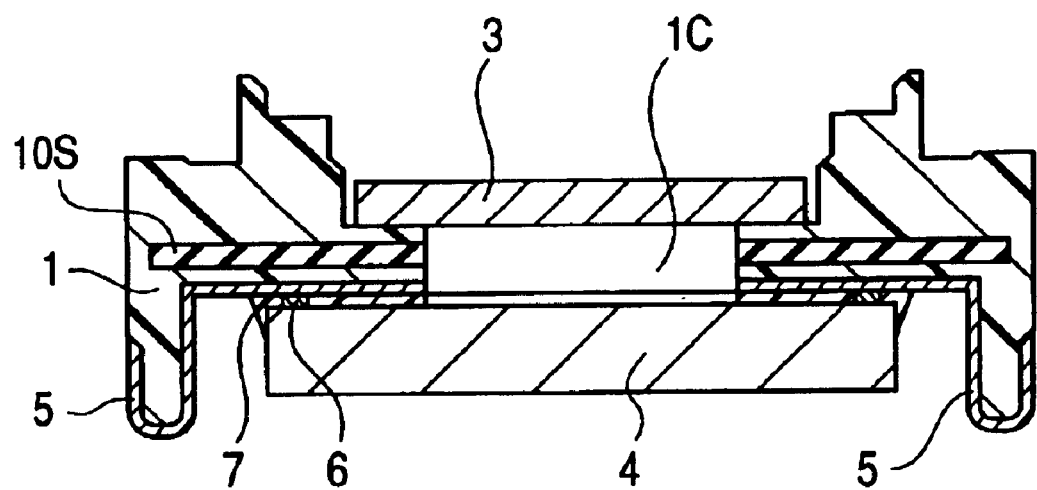
FIG. 7 is a view showing a solid-state imaging apparatus of a third embodiment of the invention.

Next, a third embodiment of the invention will be described with reference to FIG. 7.

In the second embodiment, the structure member 1 is formed by conducting integral molding in the state where the metal plate 10M is sandwiched at a position where the rear face of the optical filter 3 is in contact with the surface of the metal plate 10M sandwiched in the resin structure member 1. In the embodiment, as shown in FIG. 7, the ceramic plate 10S is sealed into the resin structure member 1 except the side facing to the through-opening portion 1C. However, the ceramic plate 10S may be completely sealed into the structure member 1.

The other portions are formed in the same manner as those of the second embodiment. The identical portions are denoted by the identical reference numerals.

(Embodiment 4)

Figure 8:
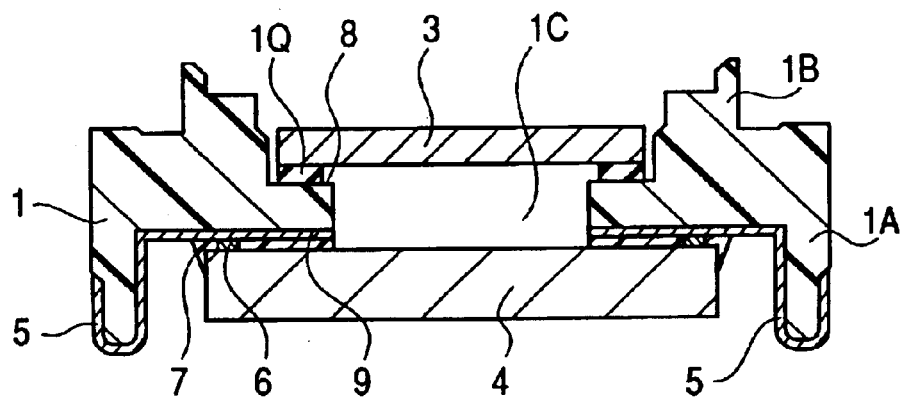
FIG. 8 is a section view showing a solid-state imaging apparatus of a fourth embodiment of the invention.

FIG. 8 is a view showing main portions of a solid-state imaging apparatus of a fourth embodiment of the invention.

According the solid-state imaging apparatus of the fourth embodiment of the invention, when a solid-state image pickup element 4 is to be connected to a resin structure member 1 having a wiring portion such as a terminal pattern 5, a fixing plate 1Q made of a polyphthalamide resin is bonded to an optical filter attaching face 8 of the resin structure member to which an optical filter 3 is to be attached, so that different molecular bonding directions are produced in the attaching face 8. The interface between the fixing plate 1Q and the resin structure member 1 is placed in close proximity to the optical filter attaching face 8.

Figure 9:
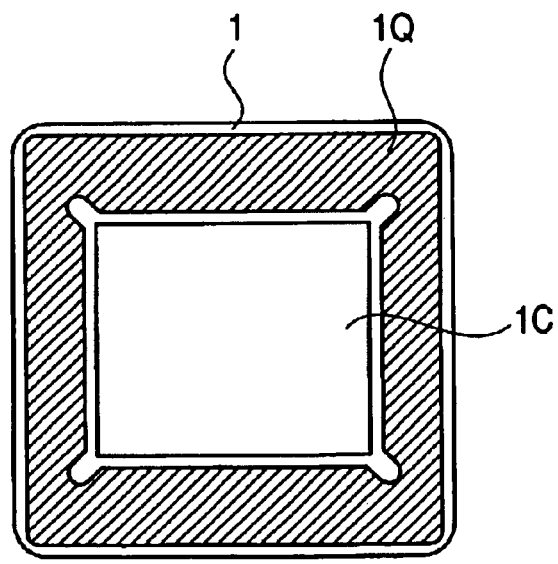
FIG. 9 is a view showing a fixing plate which is used in the fourth embodiment of the invention.

As shown in FIG. 9, the fixing plate 1Q has a rectangular annular shape of a thickness t=about 0.1 to 0.2 mm and a coefficient of thermal expansion of about 10 ppm/° C. The fixing plate 1Q is configured by an insulating polyphthalamide resin. The imaging apparatus includes: the resin structure member 1 which is made of a polyphthalamide resin, which is configured by a leg portion 1A having a rectangular table-like shape, and a body portion 1B formed on the leg portion 1A, which has a through-opening portion 1C that is formed in the interface between the leg portion 1A and the body portion 1B, and which has a wiring portion including a terminal pattern 5 in a part of the surface; the solid-state image pickup element 4 which is connected to the wiring portion, attached to the through-opening portion 1C, and electrically connected to the terminal pattern 5; and the optical filter 3 which is made of a light-transmitting resin, and which is bonded through the fixing plate 1Q to cover the through-opening portion 1C with being separated from the solid-state image pickup element 4 by a predetermined distance.

Next, a method of manufacturing the solid-state imaging apparatus will be described.

Figure 11A:
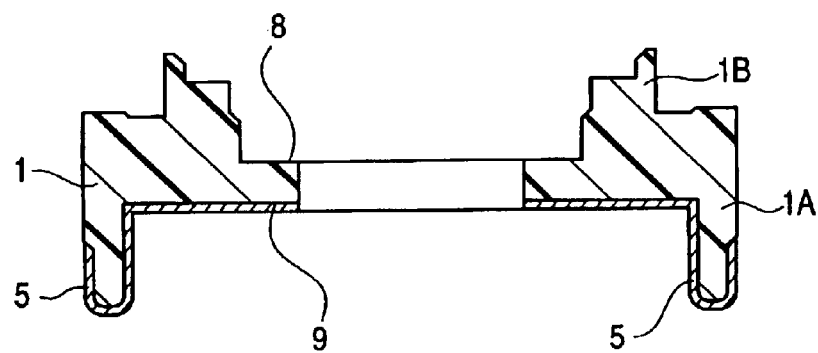
FIGS. 11A to 11D are views showing steps of mounting the solid-state imaging apparatus of the fourth embodiment of the invention.

As shown in FIG. 11A, first, the resin structure member 1 is formed by injection molding and made of a polyphthalamide resin so that the resin structure member includes the leg portion 1A having a rectangular table-like shape, the body portion 1B formed on the leg portion 1A, and the through-opening portion 1C formed in the interface between the leg portion 1A and the body portion 1B. Then, the wiring portion including the terminal pattern 5 formed on the rear face of the leg portion 1A is formed in a predetermined area of the resin structure member 1 by a plating process or a thin film process such as the sputtering technique.

Figure 11B:
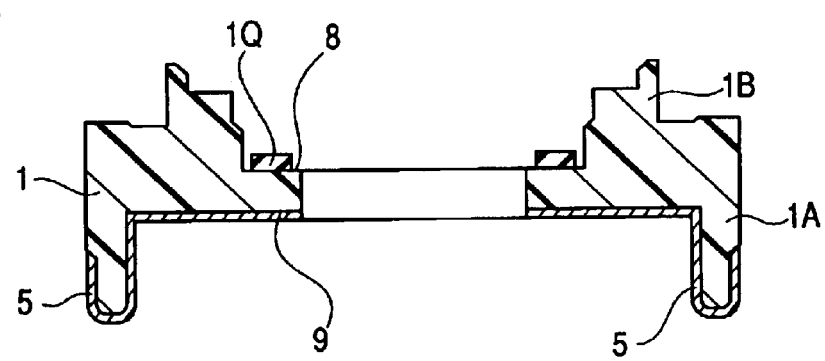

As shown in FIG. 11B, the fixing plate 10 shown in FIG. 9 made of a polyphthalamide resin is then bonded to the optical filter attaching face 8 of the resin structure member 1 by using an adhesive resin (not shown).

Figure 11C:
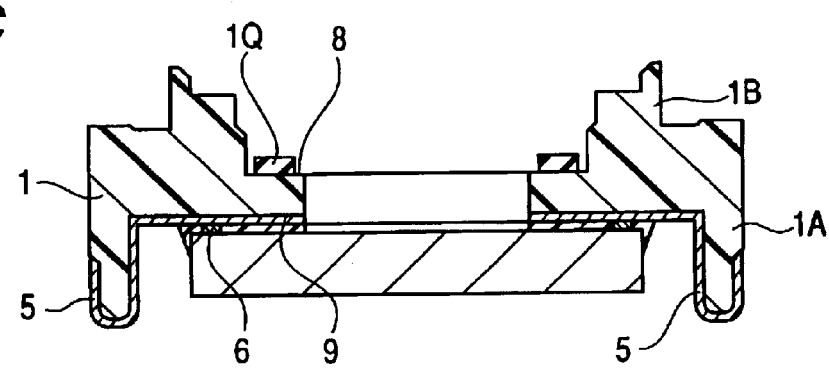

As shown in FIG. 11C, thereafter, the solid-state image pickup element (chip) 4 is mounted onto one face of the through-opening portion 1C of the resin structure member 1. Bumps 6 are previously formed on contact terminals of the solid-state image pickup element 4, and the terminals are connected by thermocompression bonding or a conductive adhesive agent to ends of the terminal patterns 5 formed on the leg portion 1A of the resin structure member 1. Then, a resin sealing process is conducted to cover the surface of the solid-state image pickup element 4 by a sealing resin 7.

Figure 11D:
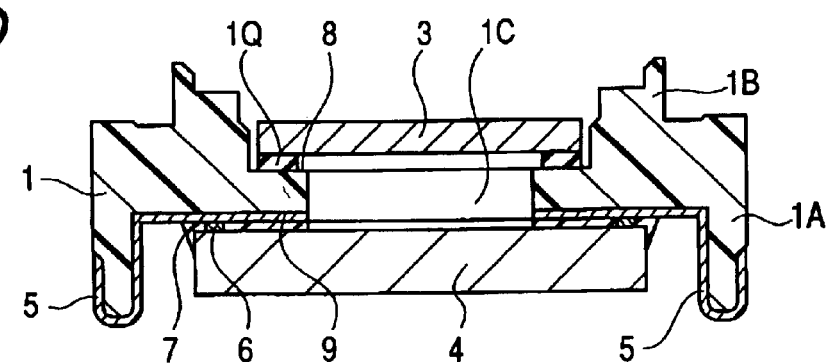

As shown in FIG. 11D, thereafter, the optical filter 3 is bonded onto the fixing plate 1Q by using an adhesive resin. Alternatively, the fixing plate 1Q and the optical filter 3 may be simultaneously bonded by using the same adhesive resin.

In the optical filter 3, a dielectric thin film of a multilayer structure having a desired refractive index is vapor-deposited onto the surface of a light-transmitting member made of a plate glass material to form a dielectric interference filter.

In the thus formed solid-state imaging apparatus, the optical filter 3 is attached on or in the vicinity of the optical filter attaching face 8 which is close to a solid-state image pickup element attaching face 9 of the resin structure member, through the fixing plate 1Q which is made of a thermoplastic resin, and which is provided to produce a difference in molecular bonding direction. Therefore, thermal deformation of the resin structure member is suppressed by the fixing plate 1Q, whereby the certainty of the connection of the solid-state image pickup element to the resin structure member can be enhanced. Since the fixing plate 1Q can be formed by the same material as the structure member, there is no difference in coefficient of thermal expansion, and hence generation of distortion can be suppressed.

The resin structure member is obtained by injection molding. The polyphthalamide resin has a straight-chain molecular structure, and hence exhibits anisotropic properties that the coefficient of thermal expansion is small in the molecular bonding direction and large in a direction perpendicular to the bonding direction.

Figure 10:
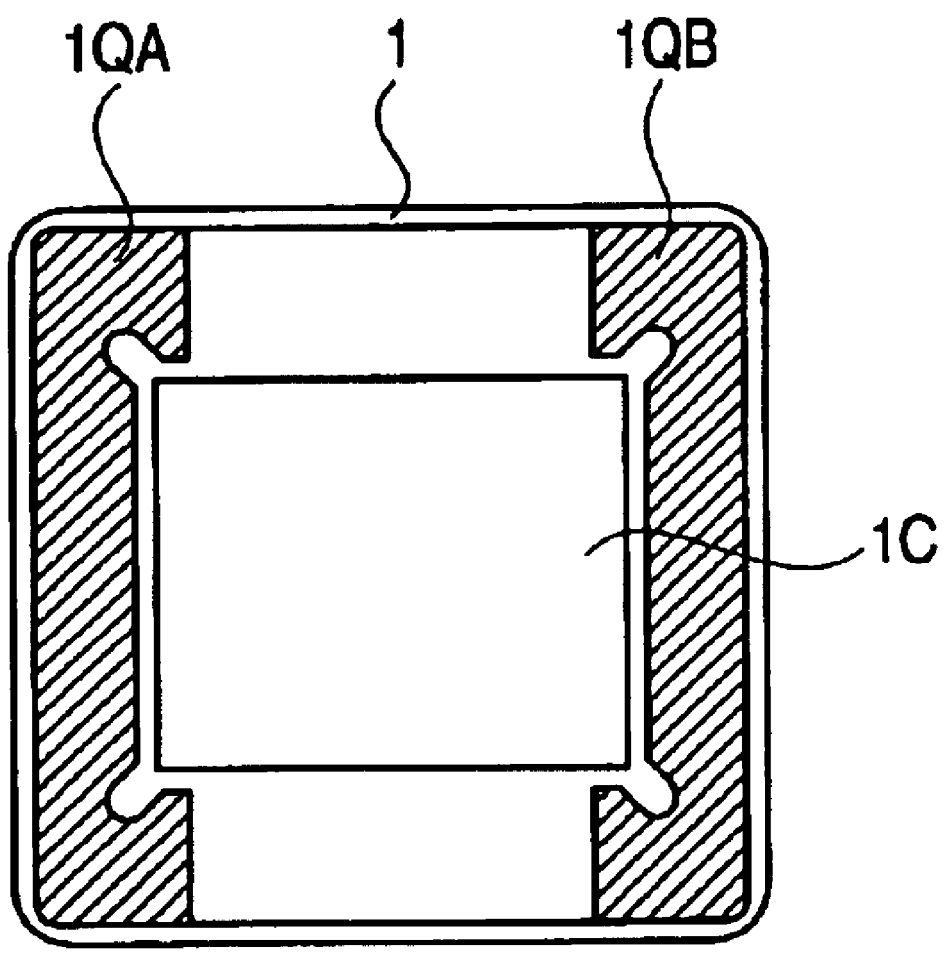
FIG. 10 is a view showing a modification of the fixing plate which is used in the fourth embodiment of the invention.

In the fourth embodiment, therefore, the fixing plate 1Q which is formed into a rectangular annular shape as shown in FIG. 9 is used. Alternatively, as shown in FIG. 10, two strip-like fixing plates 1QA and 1QB may be attached along the injection direction of the thermoplastic resin or the alignment direction of fillers so as to be parallel to each other and in parallel to the attaching face.

According to the configuration, the elongation in the direction along which larger elongation occurs is suppressed, and deformation is largely suppressed. Therefore, thermal deformation of the resin structure member in the vicinity of the solid-state image pickup element is suppressed, so that the certainty of the connection of the solid-state image pickup element can be enhanced.

(Embodiment 5)

Next, a fifth embodiment of the invention will be described with reference to FIG. 12.

According to the solid-state imaging apparatus of the fifth embodiment of the invention, the structure member 1 is integrally molded in a state where the fixing plate 1Q which is made of a PPS resin, and in which the alignment direction of molecules is different by 90 degrees from that of the resin structure member 1 made of a PPS resin is sandwiched in the resin structure member 1. In the embodiment, the structure member is formed by conducting integral molding in a state where the fixing plate 1Q is sandwiched at a position where the rear face of the optical filter 3 is in contact with the surface of the fixing plate 1Q sandwiched in the resin structure member 1. In the embodiment, the alignment direction of molecules is changed in each of interfaces of both the faces of the fixing plate 1Q and the resin structure member 1, so that the elongations in the two interfaces are suppressed.

Figure 12:
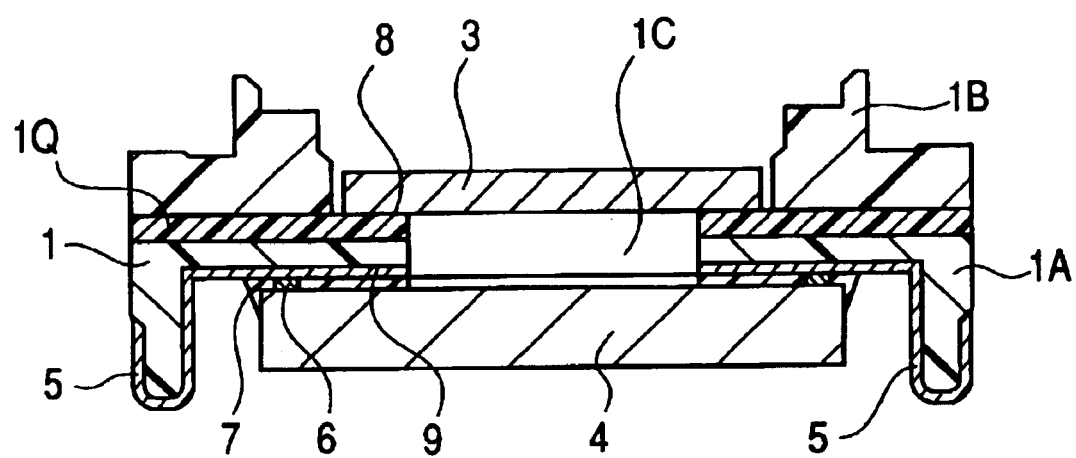
FIG. 12 is a section view showing a solid-state imaging apparatus of a fifth embodiment of the invention.

In the solid-state imaging apparatus, as shown in FIG. 12, the fixing plate 1Q having a rectangular annular shape is integrally molded between the optical filter attaching face 8 of the resin structure member 1 which has a wiring portion, and which is made of a thermoplastic resin, and the solid-state image pickup element attaching face 9 so as to be parallel to these faces, whereby deformation of the solid-state image pickup element attaching face is suppressed.

The other portions are formed in the same manner as those of the fourth embodiment. The identical portions are denoted by the identical reference numerals.

Next, a method of manufacturing the solid-state imaging apparatus will be described.

Figure 13A:
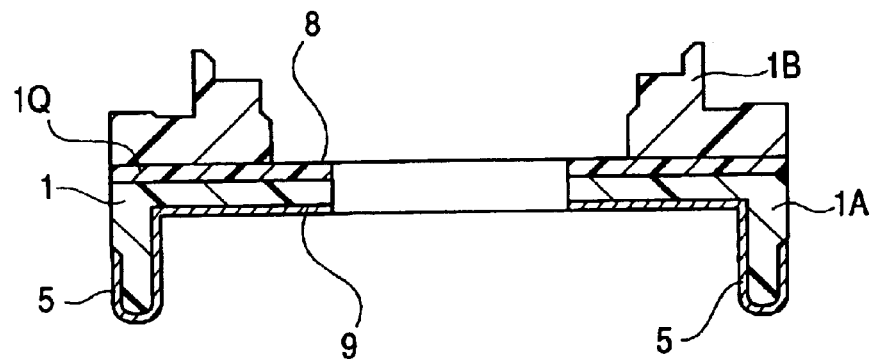
FIGS. 13A–13C are views showing steps of mounting the solid-state imaging apparatus of the fifth embodiment of the invention.

First, the fixing plate 1Q having a rectangular annular shape is placed in a cavity of injection molding dies (not shown). Under this state, while setting the injection direction so that the alignment direction of molecules is different by 90 degrees from that of the fixing plate 1Q made of a PPS resin, a PPS resin is injected into the cavity, and then cured. As a result, as shown in FIG. 13A, the resin structure member 1 is formed which is made of the PPS resin, and which is integrated with the fixing plate. Then, the wiring portion including the terminal pattern 5 formed on the rear face of the leg portion 1A is formed in a predetermined area of the resin structure member by a plating process or a thin film process such as the sputtering technique.

Figure 13B:
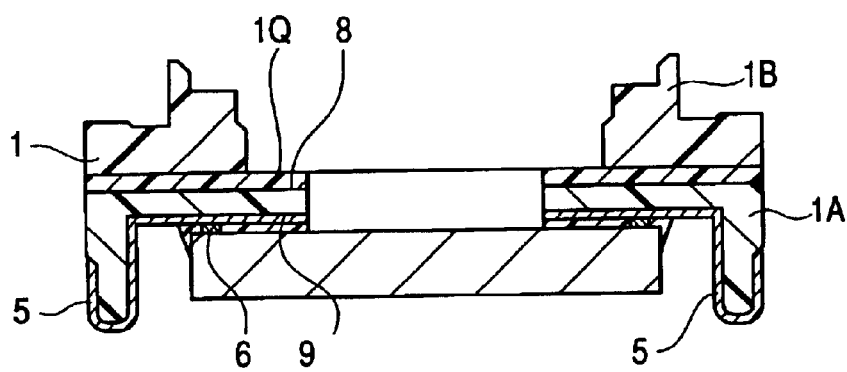

As shown in FIG. 13B, the solid-state image pickup element (chip) 4 is mounted onto one face of the through-opening portion of the resin structure member 1 into which the fixing plate 1Q is sealed to prevent deformation. Bumps 6 are previously formed on contact terminals of the solid-state image pickup element 4, and the terminals are connected by thermocompression bonding to ends of the terminal patterns 5 formed on the leg portion 1A of the resin structure member 1. Then, a resin sealing process is conducted to cover the surface of the solid-state image pickup element 4.

Figure 13C:
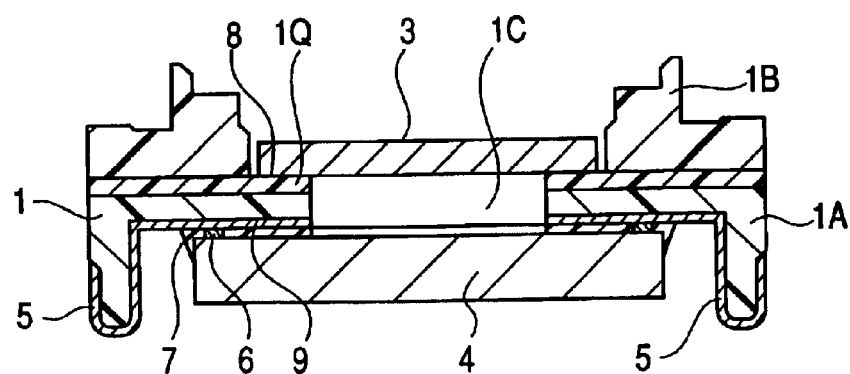

As shown in FIG. 13C, thereafter, the optical filter 3 is bonded onto the optical filter attaching face 8 of the resin structure member by using an adhesive resin.

In the same manner as the optical filter used in the fourth embodiment, the optical filter 3 is a filter in which a dielectric thin film of a multilayer structure having a desired refractive index is vapor-deposited onto the surface of a light-transmitting member made of a plate glass material to form a dielectric interference filter.

In the thus formed solid-state imaging apparatus, the solid-state image pickup element 4 is attached, in the state where the fixing plate 1Q which is made of a PPS resin in which the alignment direction of molecules is different by 90 degrees from that of the resin structure member 1 is sealed, on the optical filter attaching face 8 which is close to the solid-state image pickup element attaching portion 9 of the structure member 1. Therefore, thermal deformation of the resin structure member 1 is suppressed by the fixing plate 1Q, whereby the certainty of the connection of the solid-state image pickup element 4 can be enhanced.

According to the configuration, since the fixing plate 1Q which is made of a PPS resin, and in which the alignment direction of molecules is different by 90 degrees from that of the body of the resin structure member is molded so as to be embedded in the resin molding step, the fixing plate 1Q is formed very easily and surely, and easily mounted. Since the fixing plate 1Q and the resin structure member 1 are configured by the same resin, no difference in coefficient of thermal expansion is produced in the interface, and there is no fear that separation occurs. In the injection molding step, the interface with the fixing plate is in a fusion bonded state, and hence very excellent adhesiveness is attained.

Preferably, the melting point of the resin constituting the fixing plate 1Q is set to be slightly higher than that of the resin constituting the resin structure member 1. According to the configuration, the fixing plate does not melt during the process of injection molding, and hence the satisfactory shape of the fixing plate and the alignment direction of molecules can be surely maintained, so that the strength in the interface can be enhanced.

(Embodiment 6)

Figure 14:
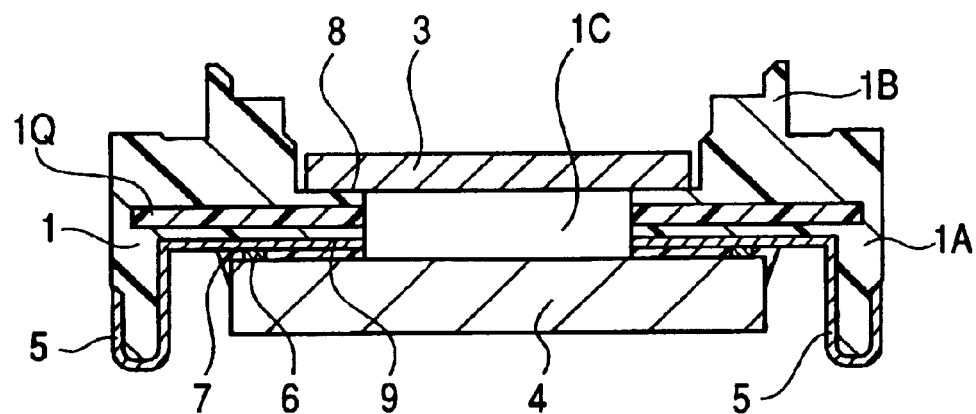
FIG. 14 is a view showing a solid-state imaging apparatus of a sixth embodiment of the invention.

Next, a sixth embodiment of the invention will be described with reference to FIG. 14.

In the fifth embodiment, the resin structure member is formed by conducting integral molding in the state where the fixing plate 1Q which is made of a PPS resin, and in which the alignment direction of molecules is different by 90 degrees is sealed into the resin structure member 1 at a position where the rear face of the optical filter 3 is in contact with the surface of the fixing plate 1Q. According to the sixth embodiment, as shown in FIG. 14, the fixing plate 1Q is sealed into the resin structure member 1 except a side facing to the through-hole portion 1C. However, the fixing plate 1Q may be completely sealed into the resin structure member 1.

The other portions are formed in the same manner as those of the fifth embodiment. The identical portions are denoted by the identical reference numerals.

According to the configuration, although the design of molding dies is slightly more complex, the adhesiveness of the resin structure member 1A and the fixing plate 1Q is further improved, so that it is possible to provide amounting structure of high reliability.

(Embodiment 7)

Figure 15:
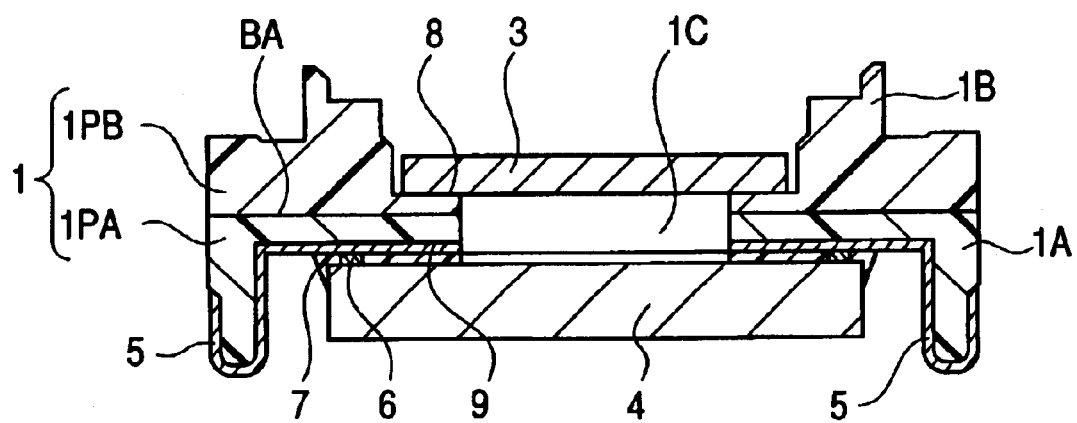
FIG. 15 is a section view showing a solid-state imaging apparatus of a seventh embodiment of the invention.

Next, a seventh embodiment of the invention will be described with reference to FIG. 15.

In the fourth to sixth embodiments, the interface of different alignment directions of molecules is formed by bonding or integrally molding the fixing plate 1Q which is made of a resin, and which has a different alignment direction of molecules. According to the seventh embodiment, as shown in FIG. 15, the structure member 1 is configured by at least two split structure members 1PA and 1PB which are molded in a split manner to produce different molecular bonding directions in an interface BA, and formed by bonding together the split structure members 1PA and 1PB.

The other portions are formed in the same manner as those of the fourth to sixth embodiments. The identical portions are denoted by the identical reference numerals.

Next, a method of manufacturing the solid-state imaging apparatus will be described.

Figure 16A:
FIGS. 16A to 16E are views showing steps of mounting the solid-state imaging apparatus of the seventh embodiment of the invention.
Figure 16B:
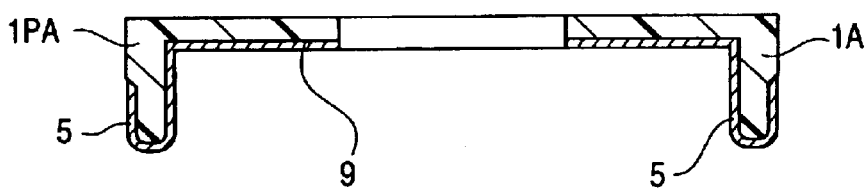

As shown in FIGS. 16A and 16B, first, the first and second split structure members 1PA and 1PB is formed by injection molding. The first and second split structure members 1PA and 1PB forms the resin structure member 1 which includes the leg portion 1A having a rectangular table-like shape, the body portion 1B formed on the leg portion 1A, and the through-opening portion 1C formed in the interface between the leg portion 1A and the body portion 1B, and which is made of a polyphthalamide resin. The structure member 1 consists of the first and second split structure members 1PA and 1PB to have a shape in which the resin structure member 1 is split into two portions in a middle portion of the through-opening portion 1C. The first and second split structure members 1PA and 1PB are formed so that their alignment directions of molecules are different from each other by 90 degrees in the bonding face thereof. Then, the wiring portion including the terminal pattern 5 formed on the rear face of the leg portion 1A is formed in a predetermined area of the resin structure member 1 by a plating process or a thin film process such as the sputtering technique.

Figure 16C:
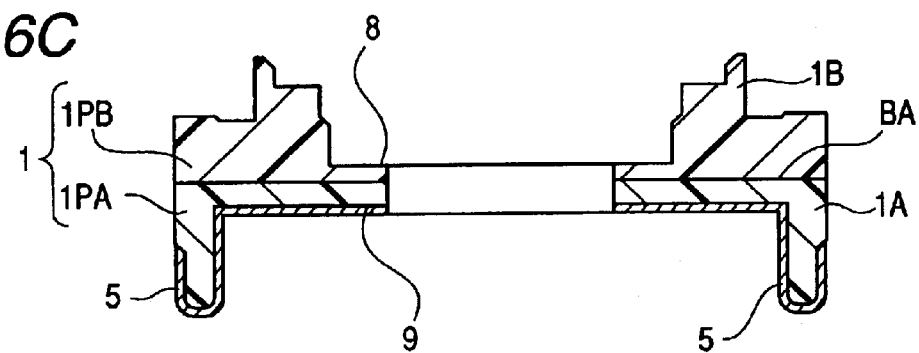

As shown in FIG. 16C, thereafter, the first and second split structure members 1PA and 1PB are bonded together to form the resin structure member 1 in which the alignment directions of molecules on both the sides of the interface are different from each other by 90 degrees. This bonding may be conducted by using an adhesive agent, or by a direct bonding process in which, after the interface is washed, only the vicinity of the interface is heated and pressurized in a vacuum.

Figure 16D:
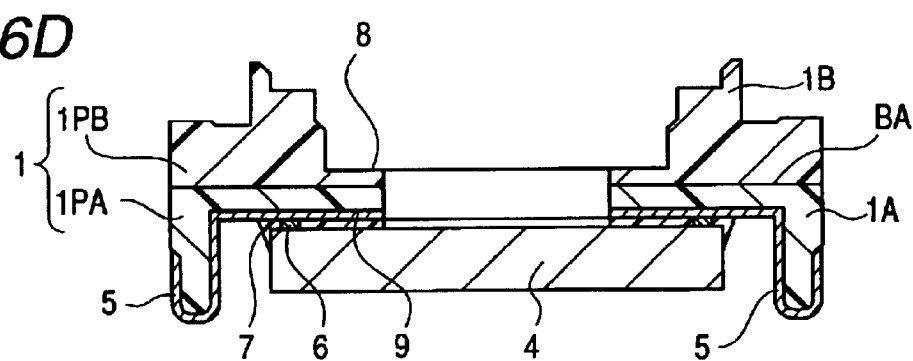

As shown in FIG. 16D, thereafter, the solid-state image pickup element (chip) 4 is mounted onto one face of the through-opening portion of the resin structure member 1. Bumps 6 are previously formed on contact terminals of the solid-state image pickup element 4, and the terminals are connected by thermocompression bonding or a conductive adhesive agent to ends of the terminal patterns formed on the leg portion 1A of the resin structure member 1. Then, a resin sealing process is conducted to cover the surface of the solid-state image pickup element 4 by a sealing resin 7.

Figure 16E:
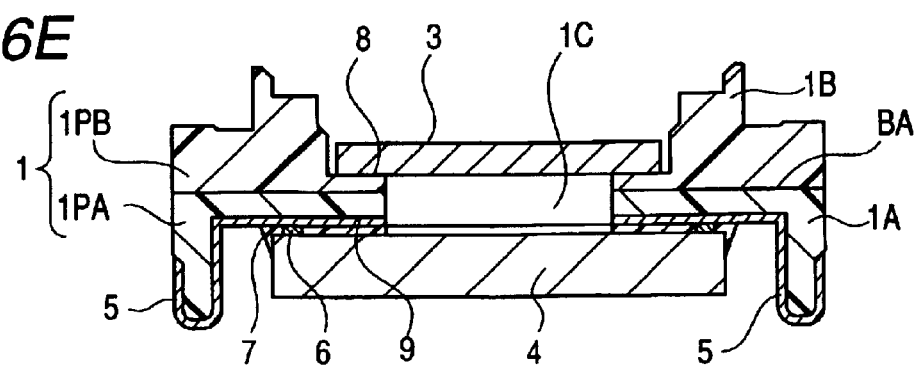
Figure 17:
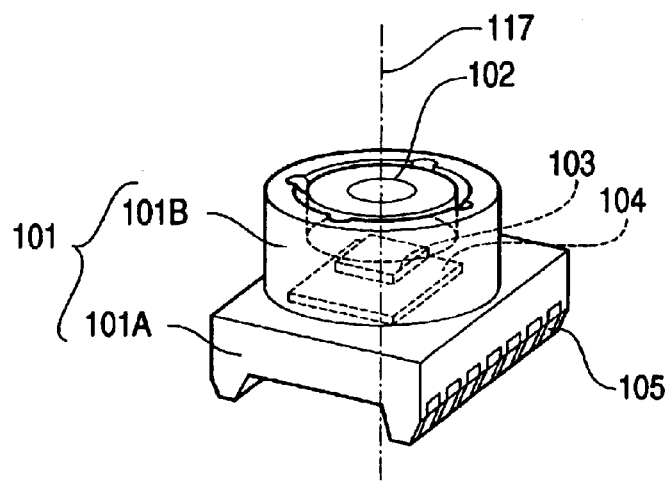
FIG. 17 is a perspective view showing a conventional solid-state imaging apparatus.
Figure 18:
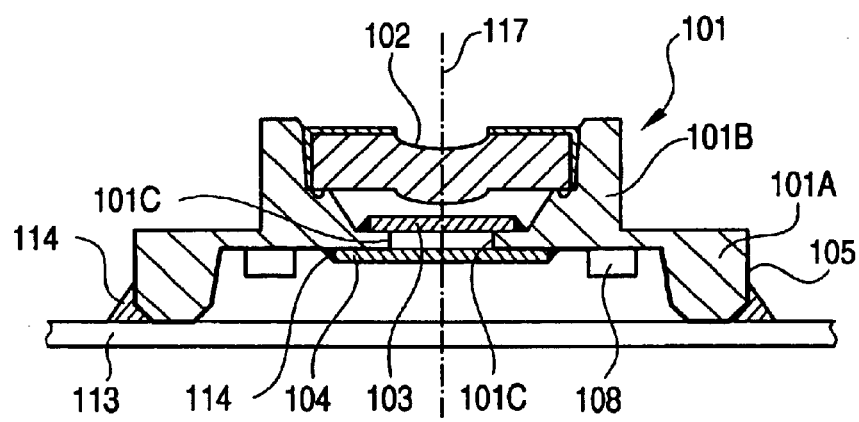
FIG. 18 is a section view showing the conventional solid-state imaging apparatus.
Figure 19:
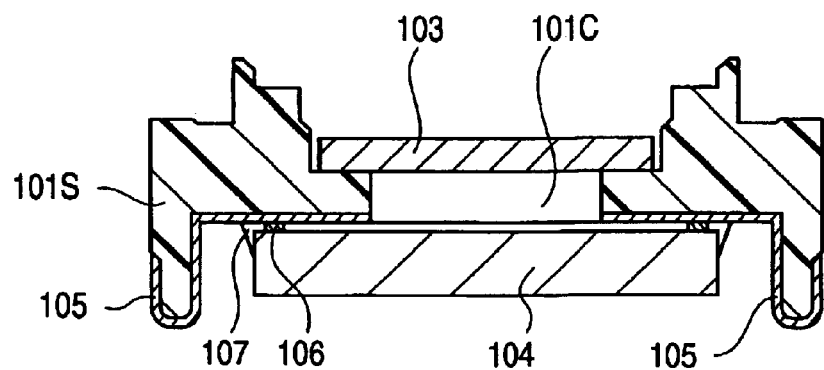
FIG. 19 is a view showing main portions of the conventional solid-state imaging apparatus.

As shown in FIG. 16E, thereafter, the optical filter 3 is bonded by using an adhesive resin.

According to the configuration, the resin structure member 1 is formed in a split manner so as to produce different molecular bonding directions in the interface, and the split members 1PA and 1PB are then bonded to each other. Therefore, it is requested only to change the injection direction while using molding dies of a cavity which is one half of that in the conventional art. Consequently, adjustment is not required. Although the number of manufacturing steps is increased, the manufacturing steps themselves can be simplified. Moreover, the configuration of the molding dies can be simplified, and the resin structure member can be easily manufactured.

Although an optical filter is used as the light-transmitting member in the first to seventh embodiments, the light-transmitting member is not restricted to an optical filter. A light-transmitting sealing member, a lens, or the like may be adequately used as the light-transmitting member.

As the resin constituting the resin structure member, a thermosetting resin such as an epoxy resin may be used in place of a thermoplastic resin such as a polyphthalamide resin or a PPS resin.

Although an optical filter is used as the light-transmitting member in the first to seventh embodiments, the light-transmitting member is not restricted to an optical filter. A light-transmitting sealing member, a lens, or the like may be adequately used as the light-transmitting member.

The application of the solid-state imaging apparatus of the invention is not restricted to a camera used in an optical communication field, and the solid-state imaging apparatus can be applied to various optical devices such as a reading device for a CD or a DVD, a reading device for a copier, a medical equipment, and a door phone.

As described above, according to the invention, the fixing member such as a ceramic plate or a metal plate which is smaller in coefficient of thermal expansion than the insulating resin is disposed in the vicinity of the solid-state image pickup element attaching portion. Therefore, a solid-state imaging apparatus is provided in which thermal deformation of the (resin) structure member made of the insulating resin can be suppressed, so that the certainty of the connection of the solid-state image pickup element can be enhanced.

Further, according to the invention, the fixing member is molded so as to be embedded into a resin molded member serving as a three-dimensional printed circuit board, in the resin molding step. Therefore, a method of manufacturing a solid-state imaging apparatus in which the fixing member is formed very easily and surely, and which is easily mounted is provided.

Further, according to the invention, the imaging apparatus includes the interface in which molecular bonding directions are different from each other, at a position which is parallel to an attaching face of the solid-state image pickup element, and in the vicinity of the solid-state image pickup element attaching face, and hence elongation directions on both the sides of the interface are different from each other. Therefore, stresses cancel each other, and expansion and contraction due to heat are reduced. In both mounting and use, deformation of the structure member is suppressed, the positional accuracy between the light-transmitting member such as an optical filter and the solid-state image pickup element can be maintained to a high level, and connection failures between the solid-state image pickup element and the wiring portion of the structure member are reduced to enhance the certainty of the connection of the solid-state image pickup element. As a result, it is possible to provide a solid-state imaging apparatus of high reliability. Moreover, occurrences of connection failures such as separation in the optical filter attaching face can be reduced. Since the structure member can be formed by the same material, there is no difference in coefficient of thermal expansion, and hence generation of distortion can be suppressed.

Furthermore, according to the invention, the structure member is formed in a split manner so as to produce different molecular bonding directions in the interface, and the split members are then bonded to each other. Therefore, the configuration of the molding dies can be simplified. It is requested only to change the injection direction while using molding dies of a cavity which is one half of that in the conventional art. Consequently, it is possible to provide a method of easily manufacturing a solid-state imaging apparatus in which adjustment is not required, and, although the number of manufacturing steps is increased, the manufacturing steps themselves can be simplified.

Still further, according to the invention, when injection molding or a thermoplastic resin is conducted by integral molding to produce an interface of different alignment directions of molecules, the structure member can be formed by integral molding which is conducted simply by changing the injection direction to form the interface. Therefore, a bonding process is not required, and the device can be easily manufactured.

Moreover, according to the invention, the fixing plate which is made of a thermoplastic resin, and which is molded so as to have a difference in molecular bonding direction is placed in injection molding dies, and usual injection molding is then conducted, whereby the fixing plate is easily sealed to suppress deformation of the structure member in the sealing portion and in the vicinity of the portion. Therefore, thermal deformation of the structure member in the vicinity of the solid-state image pickup element can be suppressed and the certainty of the connection of the solid-state image pickup element can be enhanced. Since the fixing plate can be formed by the same material as the structure member, there is no difference in coefficient of thermal expansion, and hence generation of distortion can be suppressed.

What is claimed is:

1. A solid-state imaging apparatus comprising:
   a resin structure member configured by an insulating resin and has a through-opening portion;
   a wiring portion formed on a surface of said resin structure member;
   a solid-state image pickup element connected to said wiring portion and attached to said resin structure member to cover the through-opening portion;
   a light-transmitting member attached to cover the through-opening portion to be separated from said solid-state image pickup element by a predetermined distance; and
   a fixing member placed between said light-transmitting member and said resin structure member in close proximity to a portion of said resin structure member to which said solid-state image pickup element is attached, wherein
   said fixing member is smaller in coefficient of thermal expansion than said insulating resin, and further wherein
   said resin structure member has a leg portion on which said wiring portion is formed, and a cylindrical body portion which is disposed on said leg portion, and the through-opening portion is formed between said body portion and said leg portion.

2. The solid-state imaging apparatus according to claim 1, wherein said fixing member is a plate-like member, and embedded into said resin structure member to be positioned between a portion where said solid-state image pickup element is attached and a portion where said light-transmitting member is attached.

3. The solid-state imaging apparatus according to claim 1, wherein said fixing member is a plate-like member interposed between a face of said resin structure member to which said light-transmitting member is attached, and said light-transmitting member.

4. The solid-state imaging apparatus according to claim 1, wherein said light-transmitting member is an optical filter.

5. The solid-state imaging apparatus according to claim 1, wherein said fixing member is configured by a ceramic plate.

6. The solid-state imaging apparatus according to claim 1, wherein said fixing member is configured by a metal plate.

7. The solid-state imaging apparatus according to claim 1, wherein said resin structure member is made of a thermoplastic insulating resin and formed by injection molding.

8. A solid-state imaging apparatus comprising:
   a resin structure member configured by an insulating resin and has a through-opening portion;
   a wiring portion formed on a surface of said resin structure member;
   a solid-state image pickup element connected to said wiring portion and attached to said resin structure member to cover the through-opening portion;
   a light-transmitting member attached to cover the through-opening portion to be separated from said solid-state image pickup element by a predetermined distance; and
   a fixing member placed between said light-transmitting member and said resin structure member in close proximity to a portion of said resin structure member to which said solid-state image pickup element is attached, wherein
   said fixing member is smaller in coefficient of thermal expansion than said insulating resin, and wherein
   said resin structure member is made of a thermoplastic insulating resin and formed by injection molding, and further wherein
   said fixing member is configured by two plate-like members which are placed in parallel along an alignment direction of molecules of the thermoplastic insulating resin.

9. A solid-state imaging apparatus comprising:
   a resin structure member configured by an insulating resin and has a through-opening portion;
   a wiring portion formed on a surface of said resin structure member;
   a solid-state image pickup element connected to said wiring portion and attached to said resin structure member to cover the through-opening portion;
   a light-transmitting member attached to cover the through-opening portion to be separated from said solid-state image pickup element by a predetermined distance; and
   a fixing member placed between said light-transmitting member and said resin structure member in close proximity to a portion of said resin structure member to which said solid-state image pickup element is attached, wherein
   said fixing member is smaller in coefficient of thermal expansion than said insulating resin, and wherein
   said resin structure member is made of a thermoplastic insulating resin and formed by injection molding, and further wherein
   said fixing member is configured by two plate-like members which are placed in parallel along an alignment direction of fillers of the thermoplastic insulating resin.

10. The solid-state imaging apparatus according to claim 7, wherein said fixing member is an annular plate-like member attached to the through-opening portion.

11. A solid-state imaging apparatus comprising:
    a structure member configured by an insulating resin made of a thermoplastic resin and having a through-opening portion;
    a wiring portion formed on a surface of said structure member;
    a solid-state image pickup element connected to said wiring portion and attached to said structure member to cover the through-opening portion; and
    a light-transmitting member attached to said structure member to cover said through-opening portion with being separated from said solid-state image pickup element by a predetermined distance,
    wherein said structure member includes an interface in which molecular bonding directions or alignment directions of fillers are different from each other, at a position which is parallel to a said solid-state image pickup element attaching face to which said solid-state image pickup element is to be attached, and in the vicinity of the solid-state image pickup element attaching face.

12. The solid-state imaging apparatus according to claim 11, wherein, in the interface of said structure member, the molecular bonding directions or alignment directions of fillers have a difference of 45 to 90 degrees.

13. The solid-state imaging apparatus according to claim 11, further comprising a fixing plate made of a thermoplastic resin, disposed on a light-transmitting member attaching face of the resin structure member to which said light-transmitting member is to be attached, wherein the interface is positioned between the fixing plate and the light-transmitting member attaching face to have different molecular bonding direction between the resin structure member and the fixing plate.

14. The solid-state imaging apparatus according to claim 13, wherein said fixing plate is configured by two plate-like members which are placed in parallel along an alignment direction of molecules or an alignment direction of fillers of the thermoplastic insulating resin.

15. The solid-state imaging apparatus according to claim 13, wherein said fixing plate is an annular plate-like member which is bonded to the through-opening portion.

16. A solid-state imaging apparatus according to claim 11, wherein said structure member is integrally molded to have the interface by injection molding of a thermoplastic resin.

17. The solid-state imaging apparatus according to claim 11, wherein said structure member is configured by at least two split structure members which are made of a thermoplastic resin, and which are molded in a split manner to produce different molecular bonding directions or alignment directions of fillers in said interface, and said structure member is formed by bonding said split structure members to each other.

18. The solid-state imaging apparatus according to claim 11, wherein said structure member is integrally molded to seal a fixing plate made of a thermoplastic resin, and molecular bonding directions in an interface with said fixing plate are different from each other.

19. The solid-state imaging apparatus according to claim 11, wherein said structure member has a leg portion on which said wiring portion is formed and a cylindrical body portion disposed on said leg portion, and the through-opening portion is formed between the body portion and the leg portion.

20. A solid-state imaging apparatus comprising:

a resin structure member configured by an insulating resin and has a through-opening portion;

a wiring portion formed on a surface of said resin structure member;

a solid-state image pickup element connected to said wiring portion and attached to said resin structure member to cover the through-opening portion;

a light-transmitting member attached to cover the through-opening portion to be separated from said solid-state image pickup element by a predetermined distance; and a fixing member placed between said light-transmitting member and said resin structure member in close proximity to a portion of said resin structure member to which said solid-state image pickup element is attached, wherein said fixing member is smaller in coefficient of thermal expansion than said insulating resin, and further wherein said fixing member is also between said light-transmitting member and said solid-state image pickup element.

* * * * *